(12) United States Patent
Hayashi et al.

(10) Patent No.: US 6,424,854 B2
(45) Date of Patent: *Jul. 23, 2002

(54) MRI VERTICAL MAGNET APPARATUS AND MRI APPARATUS

(75) Inventors: Yujiro Hayashi; Kazuhiko Hayakawa; Katsumasa Nose, all of Tokyo (JP)

(73) Assignee: GE Yokogawa Medical Systems, Limited, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/302,144

(22) Filed: Apr. 29, 1999

(30) Foreign Application Priority Data

Jun. 15, 1998 (JP) .............................. 10-167046

(51) Int. Cl.$^7$ .............................................. A61B 5/055
(52) U.S. Cl. ................ 600/415; 5/601; 5/611
(58) Field of Search .................. 600/410, 415; 324/307, 318, 322, 319; 5/601, 611; 335/296

(56) References Cited

U.S. PATENT DOCUMENTS

| | | | | |
|---|---|---|---|---|
| 5,210,893 A | * | 5/1993 | Uosaki et al. | 5/601 |
| 5,272,776 A | * | 12/1993 | Kitamura | 5/600 |
| 5,436,607 A | * | 7/1995 | Chari et al. | 324/318 |
| 6,011,396 A | * | 1/2000 | Eckels et al. | 600/415 |
| 6,023,165 A | * | 2/2000 | Damadian et al. | 324/318 |

FOREIGN PATENT DOCUMENTS

| | | |
|---|---|---|
| EP | 0424808 | 5/1991 |
| JP | 01305937 | 11/1989 |

* cited by examiner

*Primary Examiner*—Ruth S. Smith
(74) *Attorney, Agent, or Firm*—Moonray Kojima

(57) ABSTRACT

In order to give a physician easy access to a patient placed in an interjacent space within a vertical magnet apparatus of a vertical magnet-type MRI apparatus, support and movement mechanisms 19 are provided on respective opposing surface sides of a pair of vertical opposing magnets 11, for supporting a cradle 22 or a seat 32 of a chair on belts 18, and moving the cradle 22 or the seat 32 in the horizontal direction by motors 17 and in the vertical direction by hydraulic cylinders 13.

4 Claims, 11 Drawing Sheets

MRI VERTICAL MAGNET APPARATUS AND MRI APPARATUS

BACKGROUND OF THE INVENTION

The present invention relates to an MRI (magnetic resonance imaging) vertical magnet apparatus and an MRI apparatus, and more particularly, to an MRI vertical magnet apparatus and an MRI apparatus which are improved to give a physician (or operator) easy access to a patient (or subject) placed in an interjacent space within the vertical magnet apparatus.

FIG. 1 is a perspective view illustrating a main portion of an exemplary vertical magnet-type MRI apparatus, such as those disclosed in Japanese Patent Application No. 10-15829 (counterpart U.S. patent application Ser. No. 09/218,402).

The vertical magnet-type MRI apparatus 900 comprises a vertical magnet apparatus 50 consisting of a pair of vertical opposing magnets 11 whose opposing surfaces stand vertically, and a table apparatus 90 having a table 91 which can be hydraulically moved upward and downward and a non-magnetic cradle 22 which can be moved forward and backward in the horizontal direction by a motor.

The vertical magnet apparatus 50 is provided with up/down buttons 50ud for moving the table 91 upward and downward, and in/out buttons 50io for moving the cradle 22 forward and backward to positions inside and outside of an interjacent space of the vertical magnet apparatus 50. The "interjacent space" used herein designates a space between the vertical opposing magnets 11.

In the conventional vertical magnet-type MRI apparatus 900, the table 91 is extended into the interjacent space of the vertical magnet apparatus 50 so that the cradle 22 can be moved in and out of the interjacent space of the vertical magnet apparatus 50.

However, as shown in FIG. 2, the table 91 extending into the interjacent space obstructs easy access by a physician (or operator) D to a patient (or subject) in the interjacent space.

SUMMARY OF THE INVENTION

It is an object of the present invention to provide an MRI vertical magnet apparatus and an MRI apparatus which are improved to give a physician (or operator) easy access to a patient (or subject) in an interjacent space within the vertical magnet apparatus.

In accordance with a first aspect of the present invention, there is provided an MRI vertical magnet apparatus having a pair of vertical opposing magnets whose opposing surfaces stand vertically, wherein support and movement means is provided on each of the opposing surface sides of the pair of vertical opposing magnets, for supporting a cradle or a seat of a chair and allowing the cradle or the seat of the chair to move in the horizontal or vertical direction.

The MRI vertical magnet apparatus of the first aspect is provided with support and movement means on each of the opposing surface sides of the pair of vertical opposing magnets, for supporting a cradle or a seat of a chair and allowing the cradle or the seat of the chair to move in the horizontal or vertical direction, thereby eliminating the need to extend the table into the interjacent space. That is, since the obstructive table is eliminated in the interjacent space, a physician (or operator) D is given easy access to a patient (or subject) H in the interjacent space.

Especially, by supporting the seat of the chair by the support and movement means, imaging can be done with the patient (or subject) in a sitting position and joint motion imaging of the neck, knee, loins and the like can be suitably performed.

In accordance with a second aspect of the present invention, there is provided an MRI apparatus comprising the MRI vertical magnet apparatus as described regarding the first aspect, and a table apparatus which can be detached from the MRI vertical magnet apparatus after the cradle is transferred to the support and movement means in the MRI vertical magnet apparatus.

In the MRI apparatus of the second aspect, a table apparatus (excluding the cradle) can be detached from the MRI vertical magnet apparatus after the cradle is transferred to the support and movement means, thereby facilitating access to the patient from the side on which the table apparatus would otherwise be positioned.

In accordance with a third aspect of the present invention, there is provided an MRI apparatus comprising the MRI vertical magnet apparatus as described regarding the first aspect, and a chair apparatus which can be detached from the MRI vertical magnet apparatus after the seat is transferred to the support and movement means in the MRI vertical magnet apparatus.

In the MRI apparatus of the third aspect, a chair apparatus (excluding the seat) can be detached from the MRI vertical magnet apparatus after the seat is transferred to the support and movement means, thereby facilitating access to the patient from the side on which the chair apparatus would otherwise be positioned. Moreover, by supporting the seat of the chair by the support and movement means, imaging can be done with the patient (or subject) in a sitting position and joint motion imaging of the neck, knee, loins and the like can be suitably performed.

In accordance with a fourth aspect of the present invention, there is provided an MRI apparatus comprising an MRI vertical magnet apparatus having a pair of vertical opposing magnets whose opposing surfaces stand vertically, and an MRI table apparatus having a cradle for laying a subject and a table for supporting the cradle and capable of moving the cradle in the horizontal or vertical direction, wherein one end portion of the table is extended into an interjacent space within the MRI vertical magnet apparatus and is bifurcated.

In the MRI apparatus of the fourth aspect, one end portion of a table extending into the interjacent space within the MRI vertical magnet apparatus is bifurcated, thereby eliminating the table portion that obstructs access to the patient (or subject) H. Thus, the physician (or operator) D is given easy access to the patient (or subject) H in the interjacent space.

In accordance with a fifth aspect of the present invention, there is provided an MRI apparatus as described regarding the fourth aspect, further comprising a seat which can be locked at one end portion of the cradle or the table.

In the MRI apparatus of the fifth aspect, by locking the seat at one end portion of the cradle or the table, imaging can be done with the patient (or subject) in a sitting position and joint motion imaging of the neck, knee, loins and the like can be suitably performed.

Thus, according to the MRI vertical magnet apparatus and the MRI apparatus of the present invention, the following advantages can be obtained:

(1) Because the support and movement means is provided on each of the opposing surface sides of the pair of vertical opposing magnets, for supporting the cradle or the seat of the chair and moving the cradle or the seat of the chair in the horizontal or vertical direction, the need to extend the obstructive table into the interjacent space is eliminated, thereby giving the physician (or operator) easy access to the patient (or subject) in the interjacent space.

(2) Because one end portion of the table extending into an interjacent space within the MRI vertical magnet apparatus is bifurcated, the table portion that is obstructive of access to the patient (or subject) can be eliminated, thereby giving the physician (or operator) easy access to the patient (or subject) in the interjacent space.

Further objects and advantages of the present invention will be apparent from the following description of the preferred embodiments of the invention as illustrated in the accompanying drawings.

DETAILED DESCRIPTION OF THE INVENTION

Figure 1:
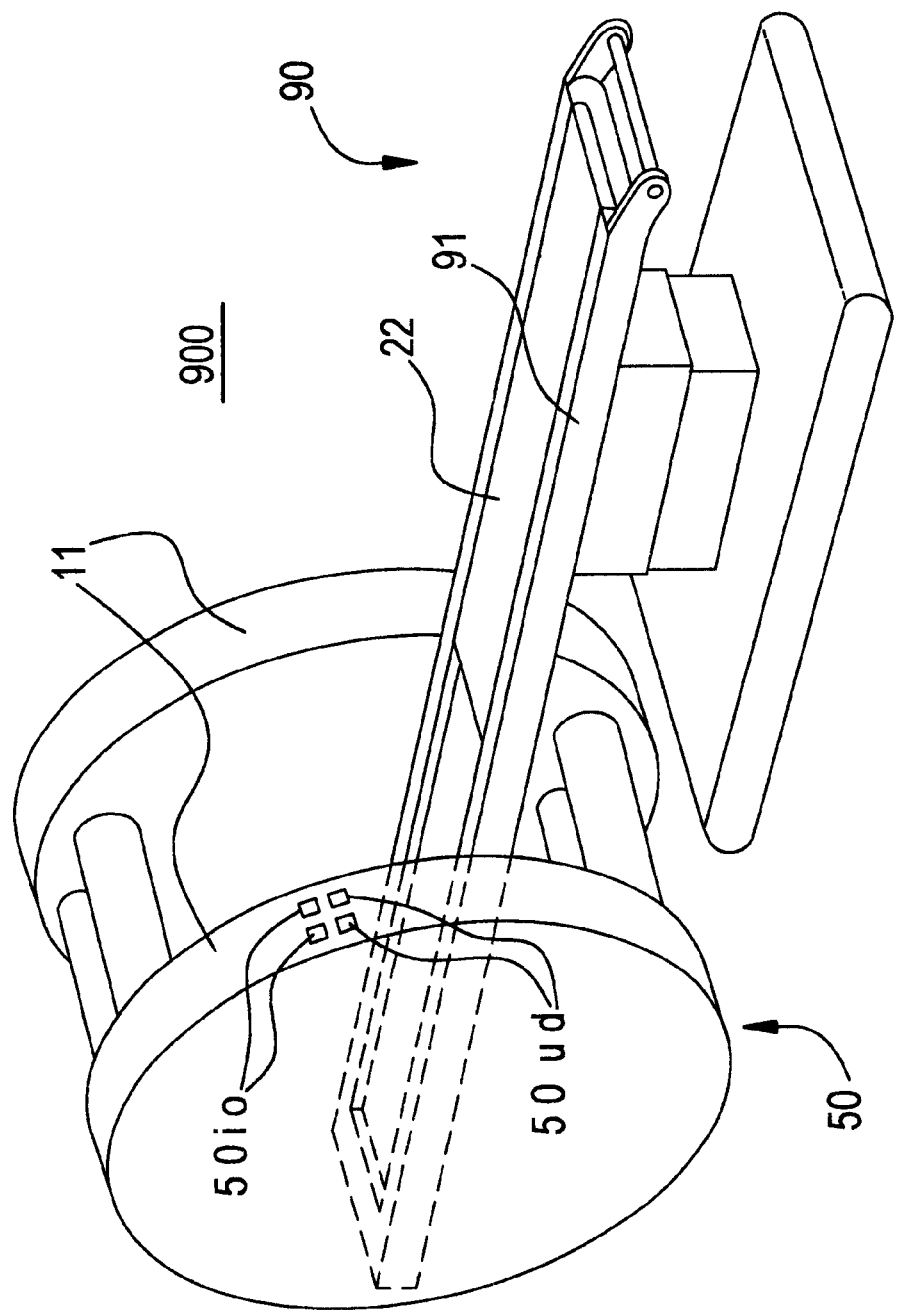
FIG. 1 is a schematic perspective view of a conventional vertical magnet-type MRI apparatus.
Figure 2:
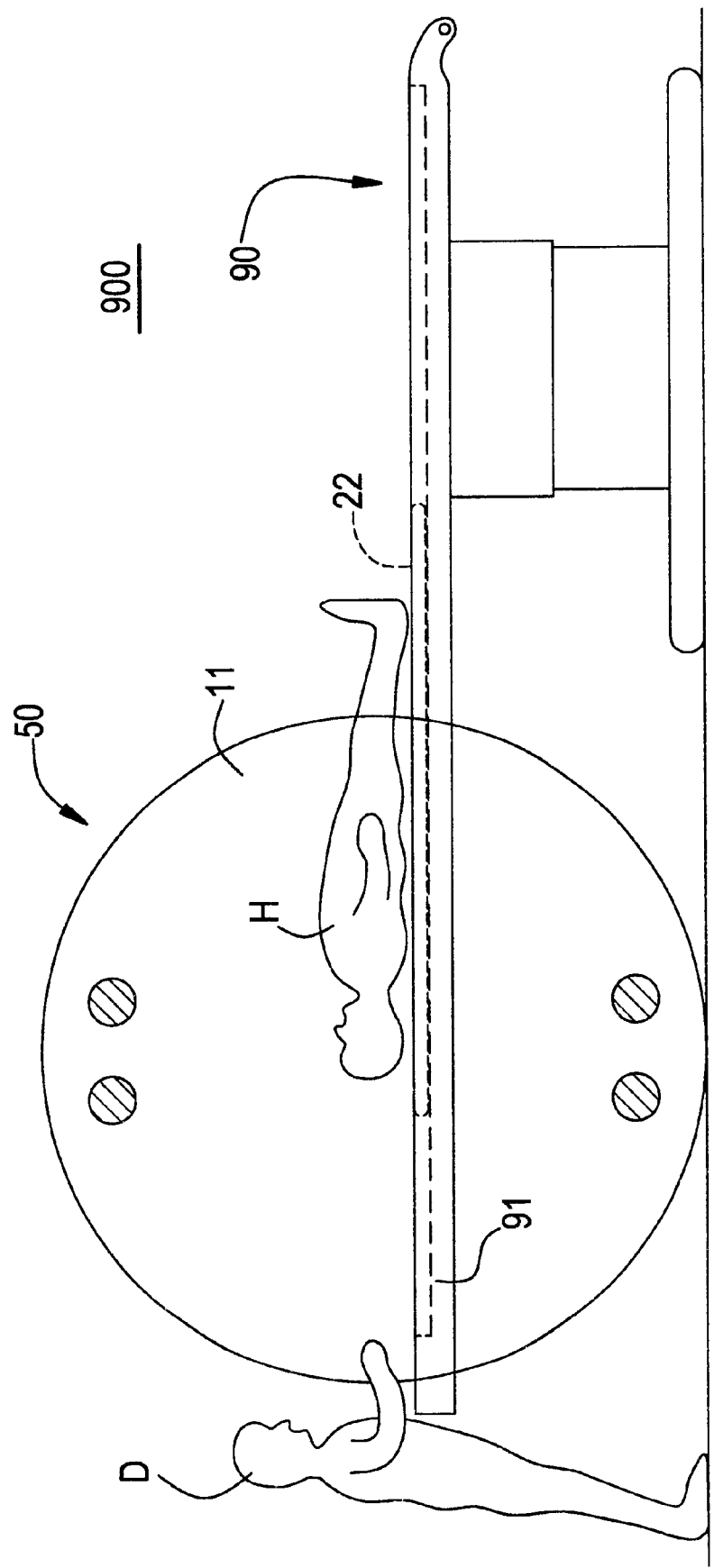
FIG. 2 illustrates the problem of the conventional vertical magnet-type MRI apparatus.
Figure 3:
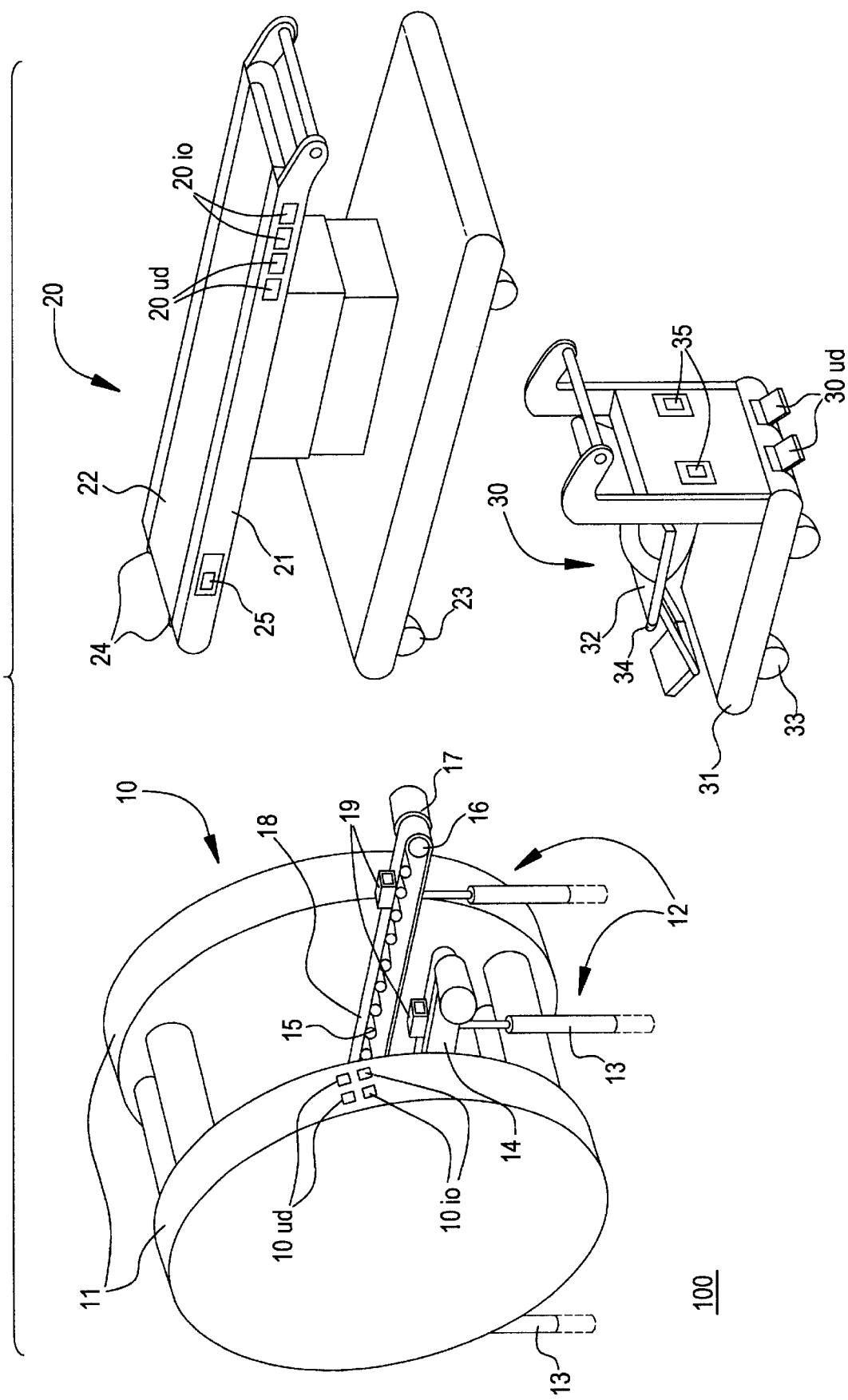
FIG. 3 is a schematic perspective view of a vertical magnet-type MRI apparatus in accordance with a first embodiment of the present invention.

The present invention will now be described in more detail with reference to embodiments shown in the accompanying drawings.
First Embodiment FIG. 3 is a schematic perspective view of a vertical magnet-type MRI apparatus in accordance with a first embodiment of the present invention.

The vertical magnet-type MRI apparatus 100 comprises a vertical magnet apparatus 10, a table apparatus 20 and a chair apparatus 30.

The vertical magnet apparatus 10 comprises a pair of vertical opposing magnets 11 whose opposing surfaces stand vertically, a laterally spaced pair of support and movement mechanisms 12 disposed on the respective opposing surface sides of the pair of vertical opposing magnets 11.

Each of the support and movement mechanisms 12 comprises a pair of hydraulic cylinders 13, a non-magnetic base panel 14 which is supported by the hydraulic cylinders 13 so that it can be moved upward and downward, a multiplicity of non-magnetic rollers 15 and a pair of pulleys 16, 16, each pivoted to the base panel 14, a motor 17 attached to the pulley 16, a belt 18 fitted over the rollers 15 and the pulleys 16, and a non-magnetic connecting block 19 secured to the belt 18.

One of the vertical opposing magnets 11 is provided with up/down buttons 10ud for moving the base panels 14 upward and downward by the hydraulic cylinders 13, and in/out buttons 10io for moving the connecting blocks 19 forward and backward in the horizontal direction by circulating the belts 18 by the motors 17.

The table apparatus 20 comprises a table 21 which can be moved upward and downward by a motor, a non-magnetic cradle 22 which can be moved forward and backward in the horizontal direction by a motor, wheels 23 for movement, connecting pins 24 which protrude from the front end of the cradle 22 and can be coupled with the connecting blocks 19, and a detach lever 25 for detaching the cradle 22 from the table 21.

The table 21 is provided with up/down buttons 20ud for moving the table 21 upward and downward, and in/out buttons 20io for moving the cradle 22 forward and backward to move the cradle 22 onto and off of the table 21.

The chair apparatus 30 comprises a base portion 31, a seat 32 removably attached to the base portion 31, wheels 33 for movement, connecting pins 34 which protrude from the front end of the seat 32 and can be coupled with the connecting blocks 19, and a detach lever 35 for detaching the seat 32 from the base portion 31.

The base portion 31 is provided with up/down pedals 30ud for moving the seat 32 upward and downward.

Figure 4:
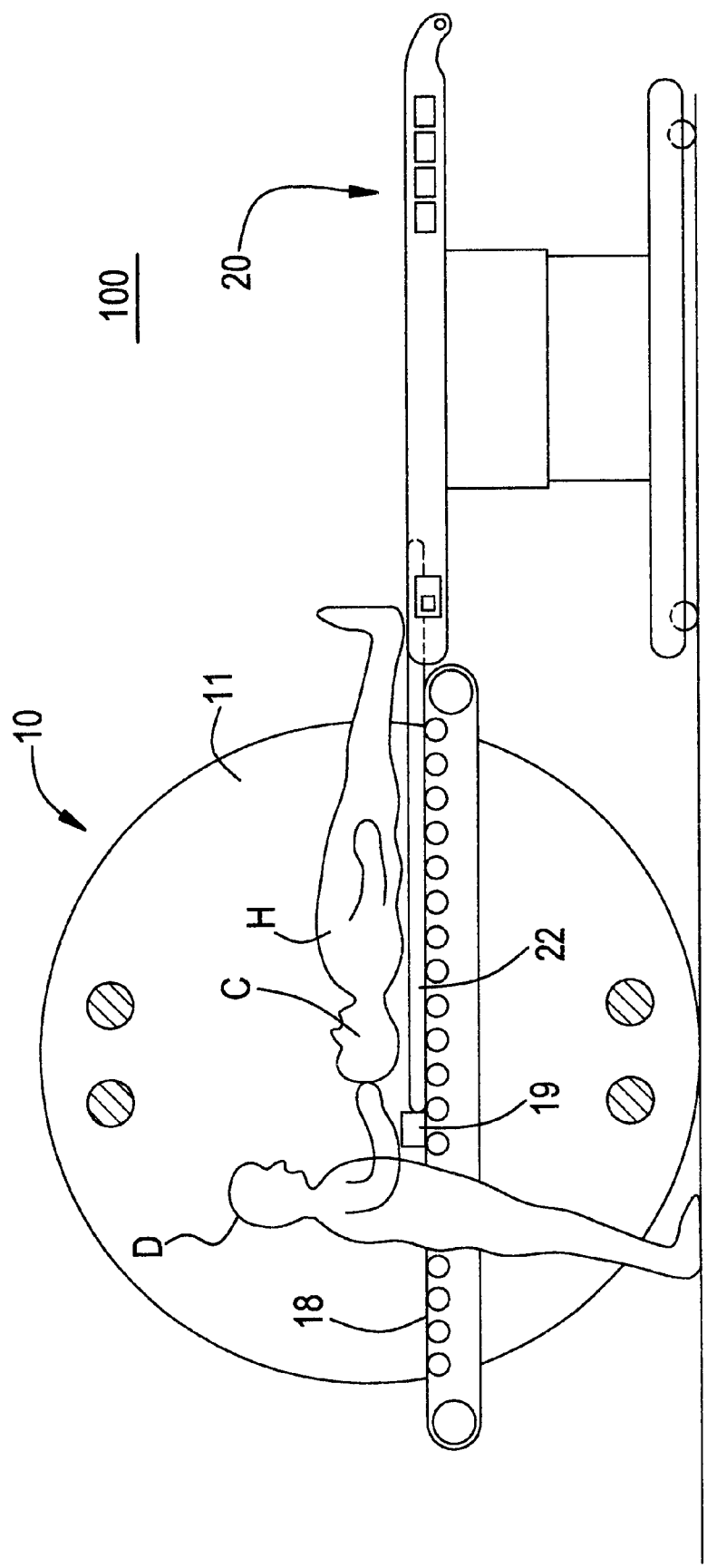
FIG. 4 is a cross sectional view showing imaging of the head by the vertical magnet-type MRI apparatus of FIG. 3.

FIG. 4 illustrates imaging of the head of a subject H using the table apparatus 20.

The up/down buttons 10ud of the vertical magnet apparatus 10 are operated to adjust the height of the belts 18 to a height suitable for imaging. The in/out buttons 10io are also operated to place the connecting blocks 19 at positions closest to the table apparatus 20. The up/down buttons 20ud of the table apparatus 20 are then operated to adjust the cradle 22 to a height aligned with the belts 18. The in/out buttons 20io are also operated to advance the cradle 22 toward the connecting blocks 19 and join the connecting pins 24 to the connecting blocks 19. Next, the in/out buttons 10io of the vertical magnet apparatus 10 are operated to draw the cradle 22 connected to the connecting blocks 19 into the interjacent space within the vertical magnet apparatus 10 and align the head of the subject H with a magnet center C. Under this condition, the head of the subject H is imaged At this time, as shown in FIG. 4, the physician D can enter a space between the pair of the support and movement mechanisms 12 and has easy access to the patient H, thereby enabling interventional examinations such as centesis while viewing a captured MRI image.

Figure 5:
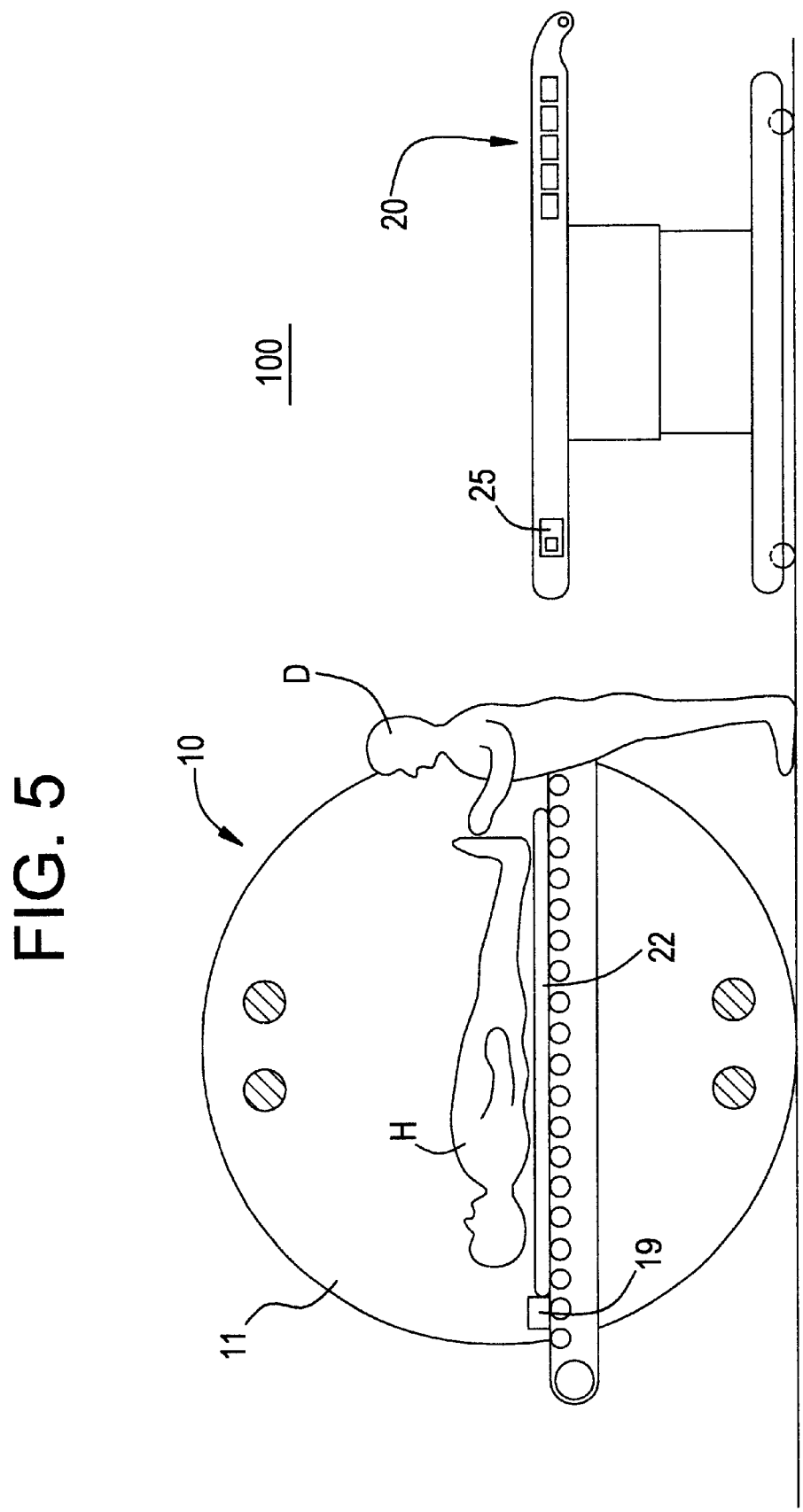
FIG. 5 is a cross sectional view showing imaging of the loins by the vertical magnet-type MRI apparatus of FIG. 3.

Moreover, as shown in FIG. 5, by operating the detach lever 25 of the table apparatus 20 to detach the cradle 22 from the table 21 and transfer the cradle to the support and movement mechanisms 12, and then moving the table apparatus 20 (excluding the cradle 22) away, a large space can be secured to give the physician D easy access to the patient H from the side on which the table apparatus 20 would otherwise be positioned. In addition, instruments for the interventional examination can be conveniently arranged.

Figure 6:
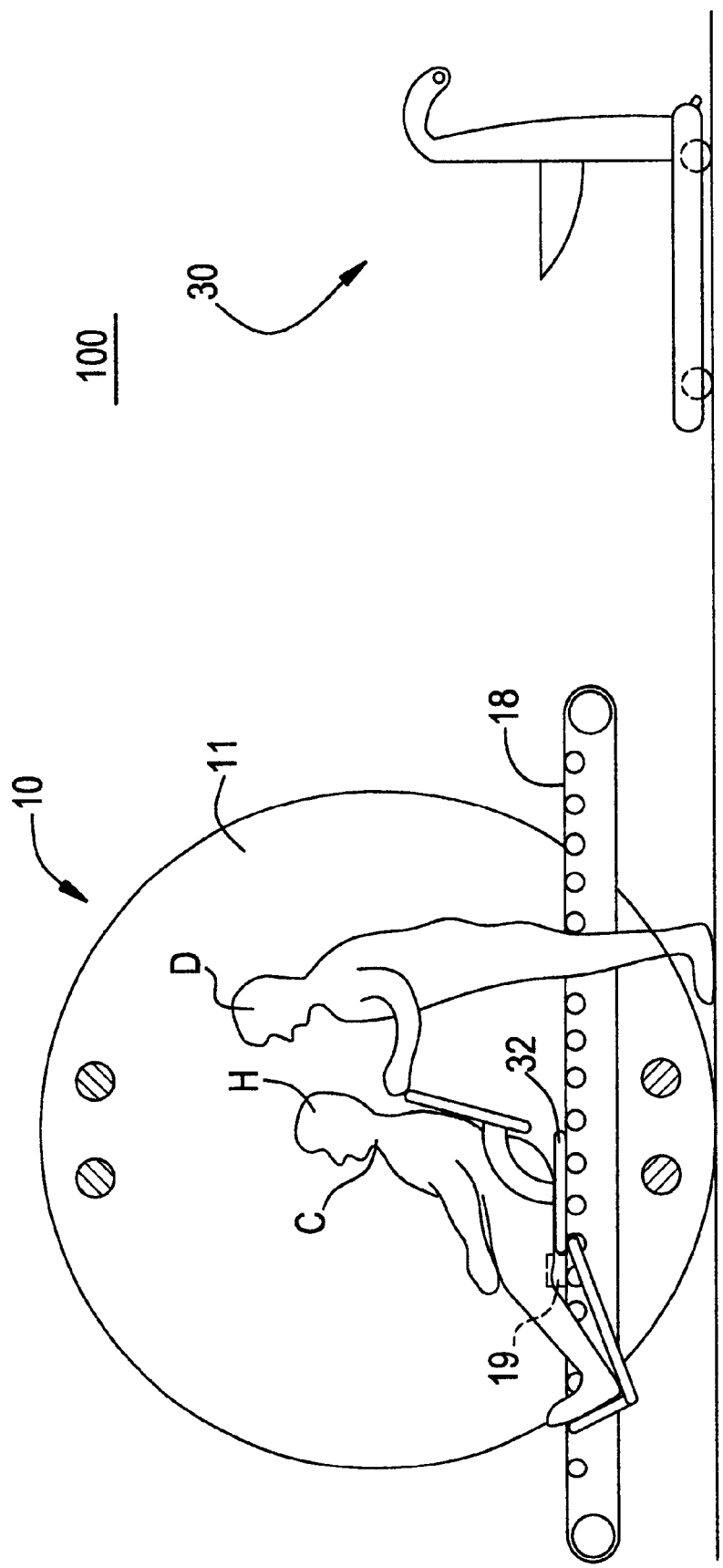
FIG. 6 is a cross sectional view showing joint motion imaging of the cervical vertebrae by the vertical magnet-type MRI apparatus of FIG. 3.

FIG. 6 illustrates joint motion imaging of the neck of the subject H using the chair apparatus 30.

The up/down buttons 10ud of the vertical magnet apparatus 10 are operated to adjust the height of the belts 18 to a height suitable for imaging. The in/out buttons 10io are also operated to place the connecting blocks 19 at positions closest to the chair apparatus 30. The up/down pedals 30ud of the chair apparatus 30 are then operated to adjust the seat 32 to a height aligned with the belts 18. The chair apparatus 30 is then moved to join the connecting pins 34 of the seat 32 to the connecting blocks 19. Next, the detach lever 35 of the chair apparatus 30 is operated to detach the seat 32 from the base portion 31 and transfer the seat 32 to the support and movement mechanisms 12, and then the chair apparatus 30 (excluding the seat 32) is moved away. Then, the in/out buttons 10*io* of the vertical magnet apparatus 10 are operated to draw the seat 32 connected to the connecting blocks 19 into the interjacent space within the vertical magnet apparatus 10 and align the neck of the subject H with the magnet center C.

Then, as shown in FIG. 6, the operator D can enter a space between the pair of the support and movement mechanisms 12 and has easy access to the patient H, thereby enabling suitable joint motion imaging of the neck of the subject H.

Figure 7:
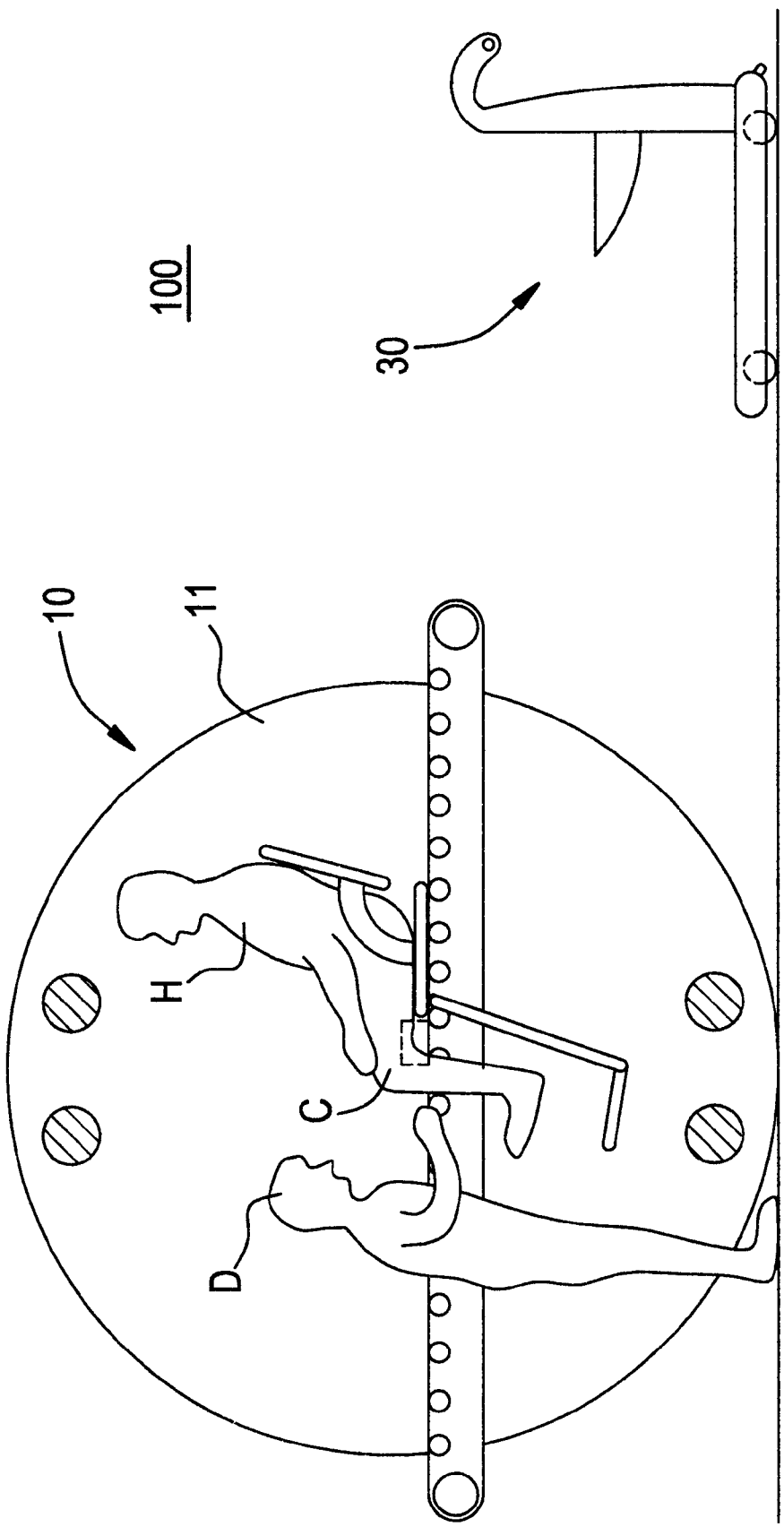
FIG. 7 is a cross sectional view showing joint motion imaging of the knee joint by the vertical magnet-type MRI apparatus of FIG. 3.

Furthermore, as shown in FIG. 7, when the knee of the subject H is aligned with the magnet center C, joint motion imaging of the knee of the subject H can be suitably performed.

Figure 8:
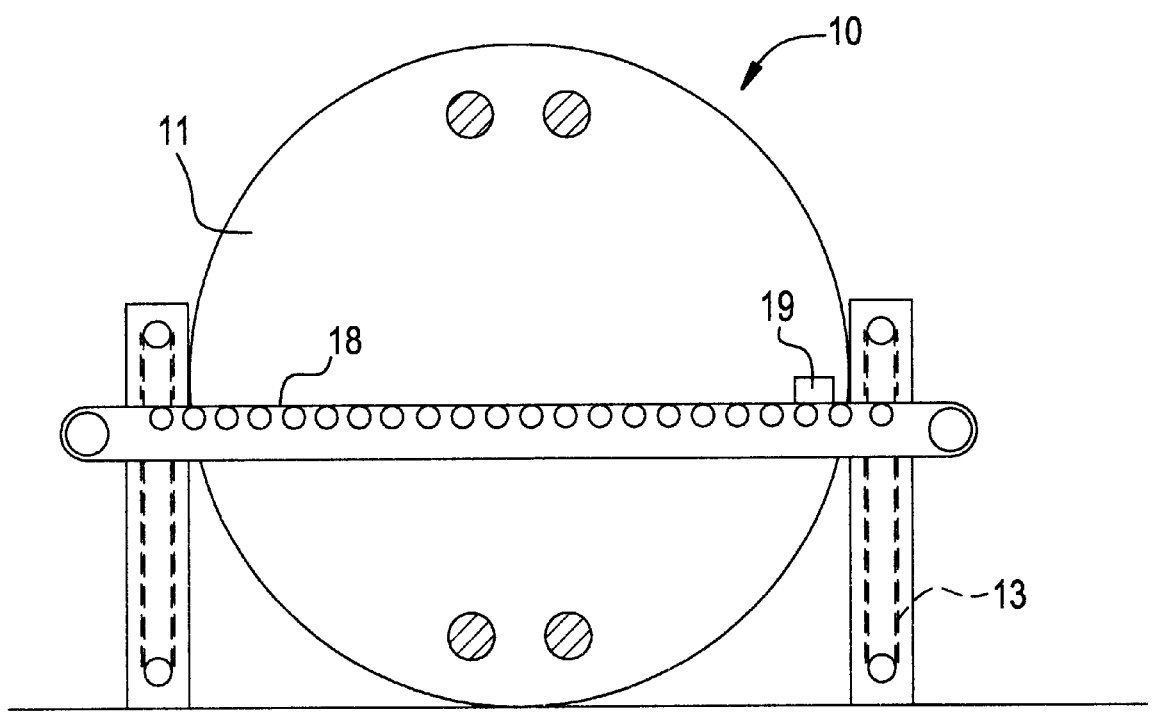
FIG. 8 is a cross sectional view showing another example of the support and movement mechanism.

As in the exemplary variation shown in FIG. 8, it is possible to employ a vertical magnet apparatus 10' comprising support and movement mechanisms 12' for achieving upward and downward movement by means of chains 13' circulated by a motor.

Second Embodiment

Figure 9:
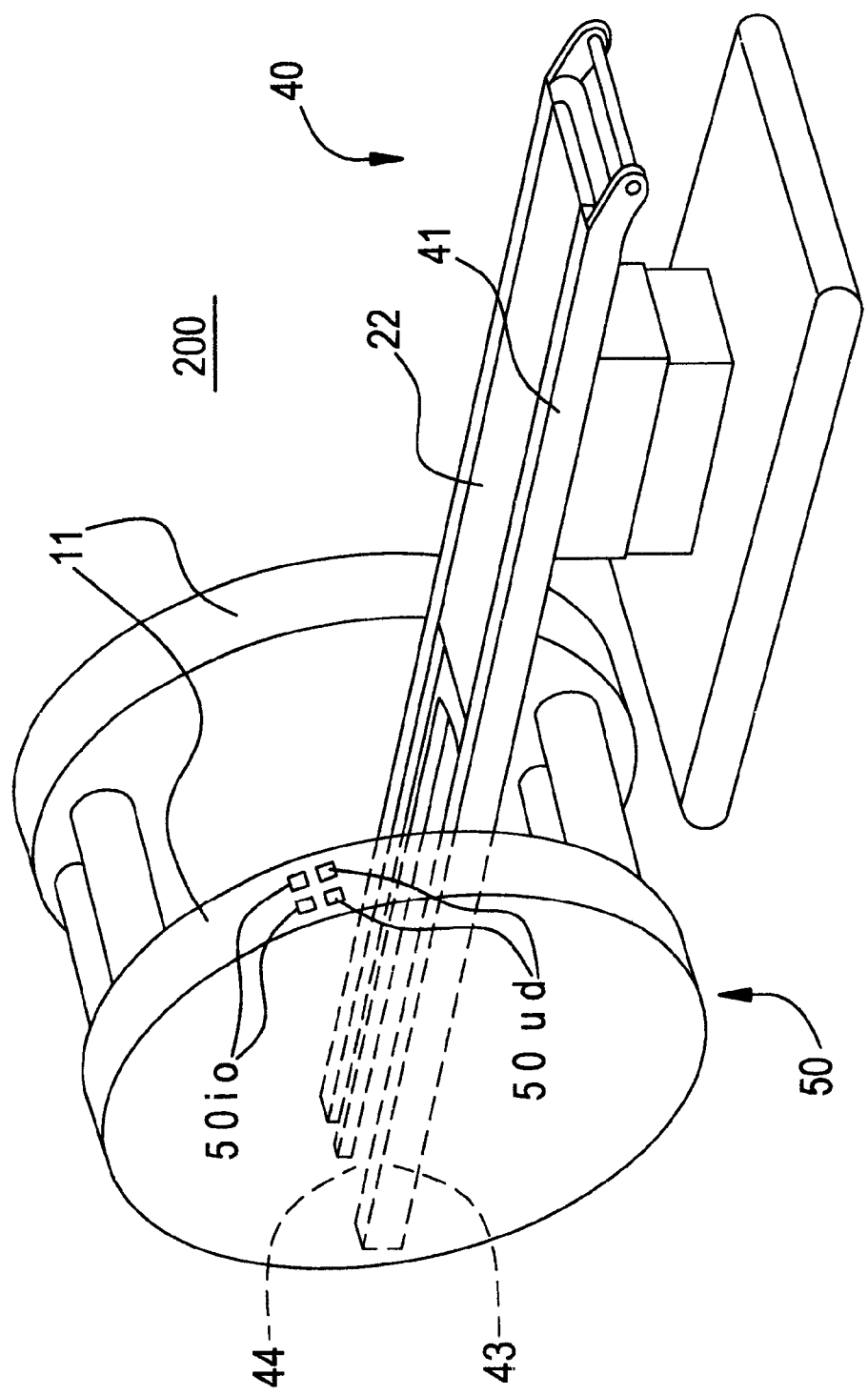
FIG. 9 is a schematic perspective view of a vertical magnet-type MRI apparatus in accordance with a second embodiment of the present invention.

FIG. 9 is a schematic perspective view of a vertical magnet-type MRI apparatus in accordance with a second embodiment of the present invention.

The vertical magnet-type MRI apparatus 200 comprises a vertical magnet apparatus 50 consisting of a pair of vertical opposing magnets 11 whose opposing surfaces stand vertically, and a table apparatus 40 having a table 41 which can be hydraulically moved upward and downward and a non-magnetic cradle 22 which can be moved forward and backward in the horizontal direction by a motor.

The vertical magnet apparatus 50 is provided with up/down buttons 50*ud* for moving the table 41 upward and downward, and in/out buttons 50*io* for moving the cradle 22 forward and backward to move the cradle 22 in and out of the interjacent space within the vertical magnet apparatus 50.

The table 41 of the table apparatus 40 is extended into the interjacent space of the vertical magnet apparatus 50 so that the cradle 22 can be moved in and out of the interjacent space of the vertical magnet apparatus 50. A portion extending into the interjacent space is bifurcated to form a bifurcated arm portion 43 defining a space for access 44.

Figure 10:
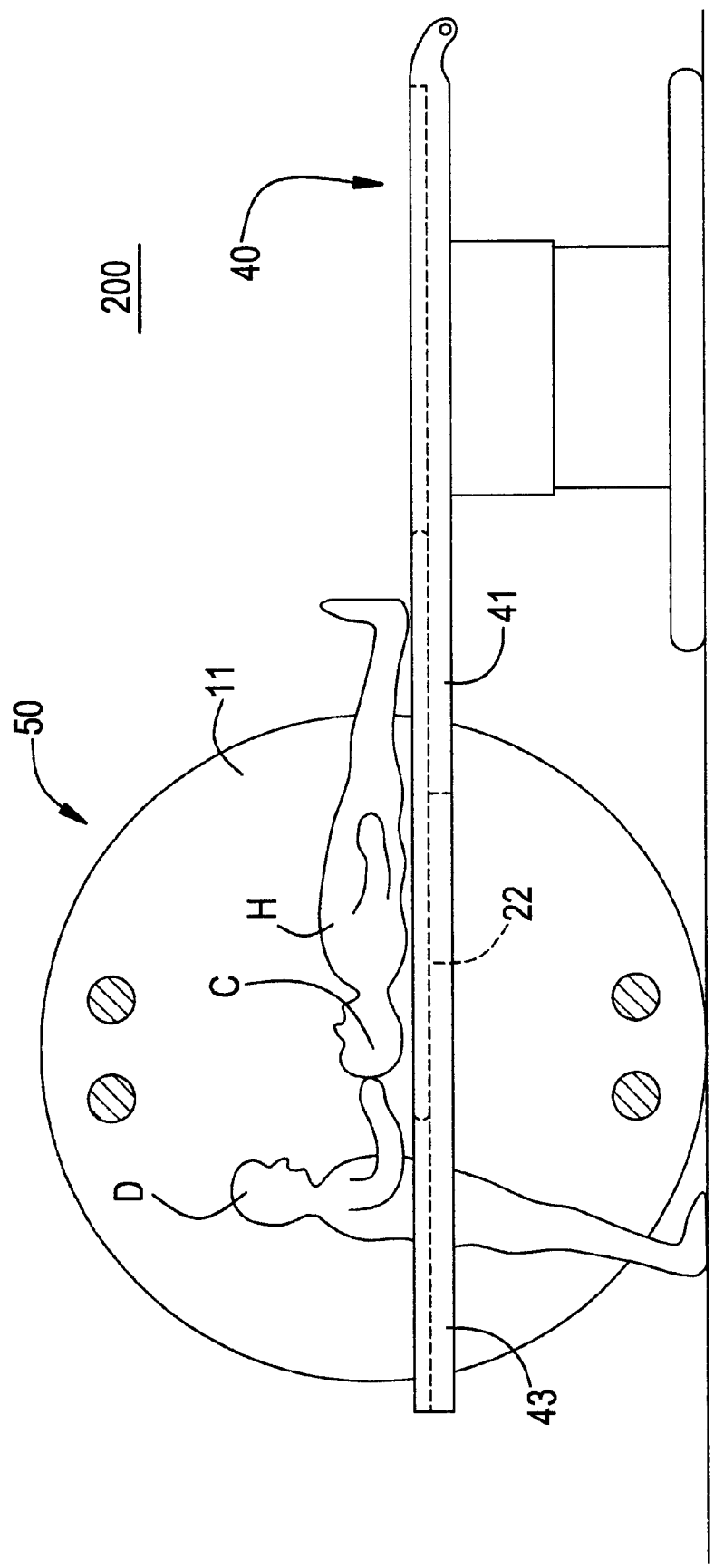
FIG. 10 is a cross sectional view showing imaging of the head by the vertical magnet-type MRI apparatus of FIG. 9.

FIG. 10 illustrates imaging of the head of the subject H.

The up/down buttons 50*ud* of the vertical magnet apparatus 50 are operated to adjust the cradle 22 to a height suitable for imaging. The in/out buttons 50*io* are also operated to draw the cradle 22 into the interjacent space within the vertical magnet apparatus 10 and align the head of the subject H with a magnet center C. Under this condition, the head of the subject H is imaged.

At this time, as shown in FIG. 10, the physician D can enter the space for access 44 within the bifurcated arm portion 43 and has easy access to the patient H, thereby enabling interventional examinations such as centesis while viewing a captured MRI image.

Figure 11:
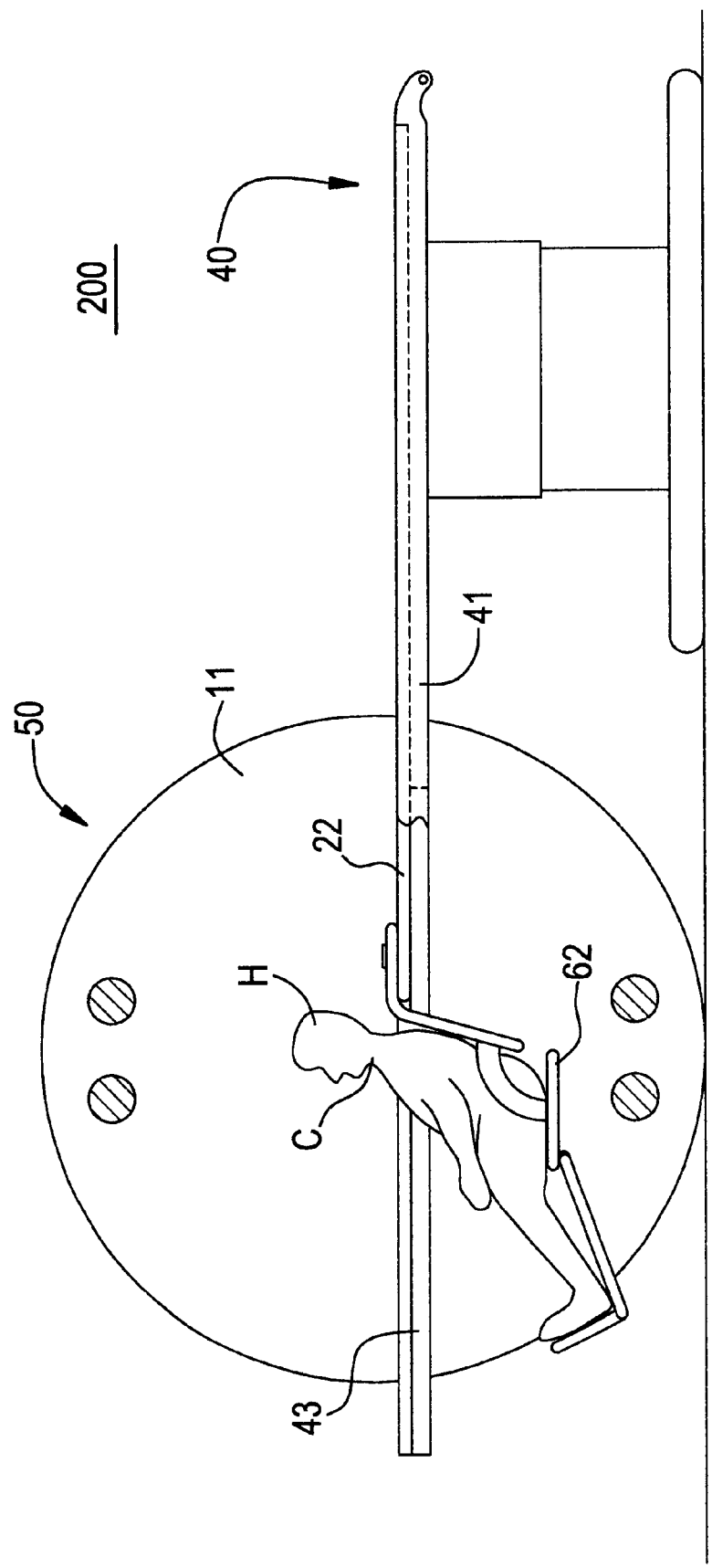
FIG. 11 is a cross sectional view showing joint motion imaging of the cervical vertebrae by the vertical magnet-type MRI apparatus of FIG. 9.

Furthermore, as shown in FIG. 11, if a seat 62 is attached at the front end of the cradle 22, the imaging can be performed with the subject H in a sitting position. This is suitable for joint motion imaging of, for example, the neck.

Many widely different embodiments of the invention may be configured without departing from the spirit and the scope of the present invention. It should be understood that the present invention is not limited to the specific embodiments described in the specification, except as defined in the appended claims.

What is claimed is:

1. A patient positioning system comprising, in combination:
   a pair of vertical magnets having opposing surfaces disposed to have a space therebetween with a magnetic center;
   a table comprising a separate movable cradle for holding horizontal said patient to be examined;
   a pair of support beams disposed inside said space and adjacent said surfaces of said pair of vertical magnets and parallel to each other with an opening therebetween;
   a pair of sets of non-magnetic rollers each set held by a respective one of said pair of support beams;
   a pair of non-magnetic continuous belts each one movably disposed over a respective one of said sets of rollers;
   first means for selectively and horizontally moving said pair of continuous belts; and
   second means for selectively moving vertically said pair of support beams and comprising a pair of vertical cylinders each one connected to a respective one of said pair of support beams;
   said separate cradle being movable horizontally from said table to top surfaces of said pair of continuous belts, and said first means then selectively moves horizontally said pair of continuous belts with said cradle thereon, thereby to selectively move said cradle into said magnetic center whereat said patient is examined.

2. The system of claim 1, wherein said table comprises:
   a bottom part;
   a plurality of wheels connected to a bottom of said bottom part;
   a Vertical piece having a bottom part connected to a top of said bottom part;
   a top part connected to a top of said vertical piece;
   said separate cradle disposed movably on top of said top part;
   means for horizontally moving said separate cradle into contact with and on top of said pair of support beams; and
   a handle connected to said top part for moving said table.

3. The system of claim 1, further comprising a separate chair in which said patient to be examined sits and which is movable into said opening between said pair of support beams in place of said table and separate cradle, said separate chair comprising:
   a horizontal part;
   a plurality of wheels connected to a bottom of said bottom part;
   a vertical back section connected to one end of said bottom part;
   a foldable seat and leg positioning device movably connected to said vertical back section; and
   a handle connected to a top of said vertical back section for moving said separate chair into said opening between said pair of support beams so that said foldable seat and leg positioning device is held by said continuous belts to be movable thereby.

4. The system of claim 3, wherein said chair further comprises lock means for locking said chair into position.

* * * * *